US012748354B2

(12) United States Patent
Pellemans et al.

(10) Patent No.: US 12,748,354 B2
(45) Date of Patent: Sep. 29, 2026

(54) OVERLAY MEASUREMENT USING BALANCED CAPACITY TARGETS

(71) Applicant: ASML Netherlands B.V., Veldhoven (NL)

(72) Inventors: Henricus Petrus Maria Pellemans, Veldhoven (NL); Benoit Herve Gaury, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 398 days.

(21) Appl. No.: 18/682,892

(22) PCT Filed: Jul. 15, 2022

(86) PCT No.: PCT/EP2022/069880
§ 371 (c)(1),
(2) Date: Feb. 9, 2024

(87) PCT Pub. No.: WO2023/016749
PCT Pub. Date: Feb. 16, 2023

(65) Prior Publication Data

US 2024/0427253 A1 Dec. 26, 2024

(30) Foreign Application Priority Data

Aug. 12, 2021 (EP) .................................... 21191161

(51) Int. Cl.
*G03F 7/00* (2006.01)
*G01R 27/26* (2006.01)
*H01J 37/28* (2006.01)

(52) U.S. Cl.
CPC ..... *G03F 7/70633* (2013.01); *G01R 27/2605* (2013.01); *G03F 7/70655* (2023.05);
(Continued)

(58) Field of Classification Search
CPC .. H01J 37/00; H01J 37/02; H01J 37/26; H01J 37/28; H01J 37/222; G01R 19/0084;
(Continued)

(56) References Cited

U.S. PATENT DOCUMENTS 4,829,243 A 5/1989 Woodard, Sr. et al.
7,935,965 B1 * 5/2011 Brozek ............... G03F 7/70633 438/18

(Continued)

FOREIGN PATENT DOCUMENTS

TW 202101515 A 1/2021

OTHER PUBLICATIONS

International Search Report issued in related International Application No. PCT/EP2022/069880, mailed Nov. 22, 2022 (3 pgs.).

(Continued)

*Primary Examiner* — Jason L McCormack
(74) *Attorney, Agent, or Firm* — FINNEGAN, HENDERSON, FARABOW, GARRETT & DUNNER, LLP

(57) ABSTRACT

A method of determining an overlay measurement of a substrate includes: injecting charge into a charge injection element of the substrate; determining a first capacitance of a first pair of elements and a second capacitance of a second pair of elements; and determining a capacitance ratio based on the first capacitance and the second capacitance. The overlay measurement may be determined based on the capacitance ratio, which may indicate an imbalance.

20 Claims, 11 Drawing Sheets

(52) U.S. Cl.
CPC .. *G03F 7/706837* (2023.05); *G03F 7/706847* (2023.05); *H01J 37/28* (2013.01)

(58) Field of Classification Search
CPC .. G01R 19/10; G01R 27/2605; G01R 31/305; G03F 7/70633; G03F 7/70655; G03F 7/70658; G03F 7/706837; G03F 7/706847; H10P 74/203
USPC .......................................... 250/306, 307, 311
See application file for complete search history.

(56) References Cited

U.S. PATENT DOCUMENTS

| | | | | |
|---|---|---|---|---|
| 2006/0128041 | A1 * | 6/2006 | Huang | G03F 9/7088<br>438/18 |
| 2021/0088917 | A1 * | 3/2021 | Tabery | G03F 7/70625 |
| 2022/0285234 | A1 * | 9/2022 | Yokomizo | H10P 74/277 |

OTHER PUBLICATIONS

Toru Koike et al., "Accuracy of Overlay Metrology with Nonpenetrating and Negative-Charging Electron Beam of the Scanning Electron Microscope," The Japanese Society of Applied Physics; Japanese Journal of Applied Physics 41 915 (2002) (4 pgs.).

Ren-Jian Feng et al., "Quantitative analysis of static capacitance contrast in scanning electron microscopy," © Japanese Society of Microscopy; J. Electron Microscopy 52(5):455-458 (2003) (4 pgs.).

* cited by examiner

OVERLAY MEASUREMENT USING BALANCED CAPACITY TARGETS

CROSS-REFERENCE TO RELATED APPLICATIONS

This application is a national stage filing under 35 U.S.C. § 371 of International Application No. PCT/EP2022/069880, filed Jul. 15, 2022, and published as WO 2023/016749 A1, which claims priority of EP Application Serial No. 21191161.5, which was filed on 12 Aug. 2021. These applications are incorporated herein by reference in their entireties.

FIELD

The description herein relates to charged particle beam inspection, and more particularly, to systems and methods for performing overlay measurement using balanced capacity targets with voltage contrast based on charged particle beams.

BACKGROUND

Measuring relative displacements of structures on a chip is a common task in the semiconductor industry. An electronic circuit may be built up on a wafer from many different layers that should be stacked on top of each other very accurately to assure a correctly functioning chip. Layer placement may be monitored by dedicated wafer overlay metrology systems. Such systems may measure the relative displacement (e.g., "overlay" or "overlay error" when elements are displaced) between two functional layers on the wafer by comparing dedicated targets included in both layers. In a lithographic process, parameters of targets or other structures may be monitored so that feed-back or feed-forward control may be performed to align layers and form patterned features accurately.

Overlay targets may be buried in a wafer, for example, below insulator films. Inspection of such targets may be difficult using optical instruments. Other methods of measuring overlay may face various limitations. Furthermore, overlay is typically not measured at the resolution of patterned features ("at-resolution") because such measurements are not straightforward. Instead, separate targets are normally used that may not necessarily resemble the high-resolution features of the final product. Improvements in systems and methods for overlay measurement are desired.

SUMMARY

Embodiments of the present disclosure provide systems and methods for overlay measurement based on charged particle beams. In some embodiments, there may be provided a charged particle beam system configured to performing overlay measurement on a substrate. A method of determining an overlay measurement of a substrate may include: injecting charge into a charge injection element of the substrate; determining a first capacitance of a first pair of elements and a second capacitance of a second pair of elements; and determining a capacitance ratio based on the first capacitance and the second capacitance. The method may further include determining the overlay measurement based on the capacitance ratio.

In some embodiments, a method of determining an overlay measurement of a substrate may include: determining a first transient property based on a first capacitance of a first pair of elements of the substrate; determining a second transient property based on a second capacitance of a second pair of elements of the substrate; and determining a capacitance ratio based on the first transient property and the second transient property.

In some embodiments, there may be provided a charged particle beam device configured to charge a substrate that may include: a first element, a second element, and a third element that are configured to be arranged symmetrically in the substrate, the first through third elements being electrically conductive, wherein a capacitive coupling is formed between the first element and the second element, and between the first element and the third element, the substrate is configured such that at least one of the first element, the second element, and the third element are charged by the charged particle beam device to enable determination of an overlay measurement, and the substrate is configured such that when the first through third elements become asymmetric, a capacitance imbalance is formed.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

DETAILED DESCRIPTION

Figure 1A:
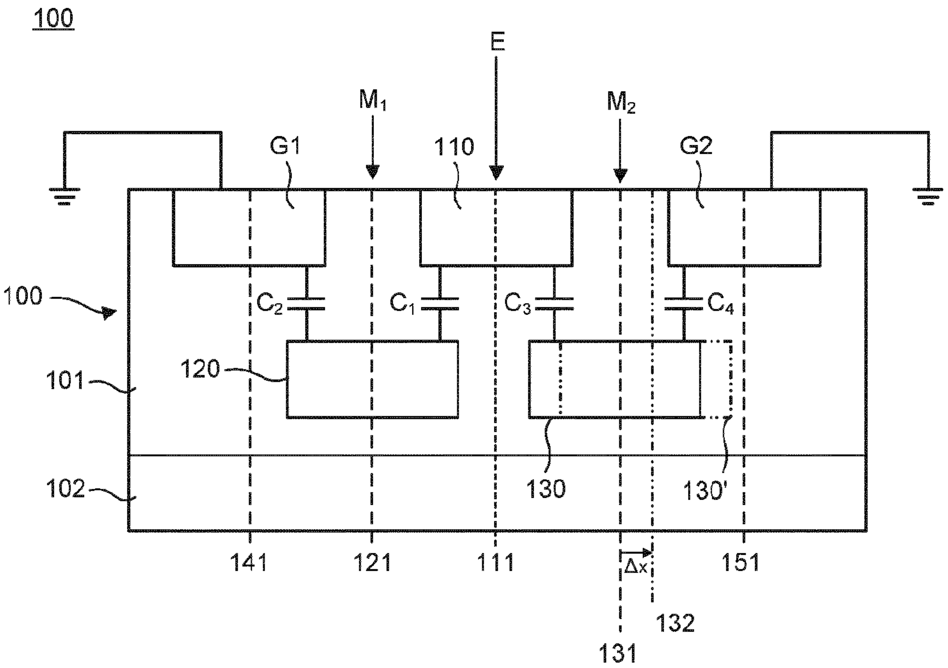
FIG. 1A illustrates a substrate 100 that may be used for wafer inspection, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Electronic devices are constructed of circuits formed on a piece of silicon called a substrate. Many circuits may be formed together on the same piece of silicon and are called integrated circuits or ICs. With advancements in technology, the size of these circuits has decreased dramatically so that many more of them can fit on the substrate. For example, an IC chip in a smart phone can be as small as a fingernail and yet may include over 2 billion transistors, the size of each transistor being less than 1/1,000th the width of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur. To enhance throughput (e.g., the number of samples processed per hour), it is desirable to conduct inspection as quickly as possible.

One type of inspection may include overlay measurement. Positions of structures in various layers in a chip may be inspected to ensure that the structures are stacked on top of each other in their proper location. Relative displacements between structures in different layers may be important to the proper functioning of a chip, but it is difficult to measure structures that are buried beneath the surface of the wafer. Some techniques for performing overlay measurement may include optical metrology, soft x-ray, and direct scanning of an electron beam. However, each technique may face limitations. For example, for optical metrology, feature sizes of modern semiconductor manufacturing processes are much too small for direct evaluation with optical (e.g., visible light or infra-red) metrology; also, the footprint of optical metrology targets is larger than desired. Soft x-ray technology is not fully mature, and such instruments are large. Direct scanning of an electron beam may involve tracing the beam over the entire sample in a rasterized pattern, which is very time consuming, and its signal-to-noise ratio is proportional to the scan area.

Some embodiments of the disclosure may provide systems and methods for performing overlay measurements based on capacitance. Capacitance is the ability of a component to store electric charge. When conductive materials are placed near one another with an insulating material between them, they may act like a capacitor. Measuring capacitance may be useful to determine properties of structures that are buried beneath a surface layer of a wafer. Overlay measurements, e.g., relative displacements of structures that may be in different layers of a wafer, may be determined by detecting changes in capacitance. Changes in capacitance may be determined by detecting voltage.

Some embodiments may also use a type of SEM imaging called voltage contrast imaging. In voltage contrast imaging, an external bias may be applied to a device, and a charged particle beam may be used to analyze variations in contrast in the imaged features. For example, charge may be injected into one of several floating elements (a charging element) by a first electron beam. Also, a measurement beam may be applied to a different one of the floating elements (a target element), and an image may be generated of the target element (e.g., by generating a SEM image). In a SEM image, the brightness of a feature (e.g., its "grey level" in a greyscale SEM image) relative to its surroundings may correspond to its voltage. The voltage may correspond to capacitance by a relationship that may be modeled. Thus, voltage of a feature measured by voltage contrast techniques may be used to determine capacitance results, and the capacitance results may be used to determine overlay measurements.

Some embodiments may employ a structure of a substrate having balanced capacitance in a nominal state. The structure may include floating elements that are capacitively coupled to one another. When relative dimensions between the elements shift (e.g., due to overlay errors), there may be a corresponding change in capacitance. The change in capacitance may be determined by measuring voltages of one or more of the elements. A voltage or capacitance ratio may be used to determine overlay measurements. For example, a balanced ratio may indicate that elements are aligned such that a central element is located at the exact midpoint between two side elements. Thus, the capacitance between the central element and one side element may be equal to the capacitance between the central element and the other side element. Overlay may be determined as zero. On the other hand, an imbalanced ratio may indicate that elements are displaced. For example, the central element may be closer to one side element than the other. In some embodiments, capacitance may be directly proportional to the electrostatic force between conductors, and thus the capacitance between the central element and the closer side element may be higher than the capacitance between the central element and the further-away side element. An imbalanced capacitance ratio may indicate an overlay error.

In some embodiments, the structure of the substrate may be provided with a predetermined arrangement in a nominal state. For example, the structure may be provided with a predetermined balance or symmetry. The structure may be configured such that when the structure deviates from a symmetric state, a change in capacitance is detectable.

Some embodiments may use a charged particle beam to inject charge in one of the floating elements (e.g., a charge injection element). The charge injection element may become charged so as to enable voltage contrast imaging. A charged particle beam may also be used to perform voltage contrast imaging on the other floating elements (e.g., measurement elements). Voltage of a particular measurement element may be determined. A voltage ratio (e.g., balance or imbalance) may also be determined by comparing measurements of different elements. The voltage imbalance may be proportional to capacitive properties of the structure. Based on the measured voltage, overlay measurements may be determined (e.g., displacement of an element).

Some embodiments may measure overlay without using a dedicated charge injection element. Instead, a charged particle beam may be used only to probe the measurement elements. The probing itself may cause some charging. Overlay measurements of the elements may be determined based on transient charging behavior that is affected by capacitance imbalance. Due to overlay errors, there may be a capacitance imbalance among the elements. For example, a central element may be displaced so as to be closer to one side element than another. Capacitance may be different depending on the spacing between elements, and so the capacitance between one pair of elements may be different from the other pair. When a charged particle beam probes measurement elements, detection characteristics may reveal an imbalance that is representative of displacement of an element. Overlay measurement may be based on the detected balance or imbalance.

A system may be calibrated so that measured imbalances correspond to a particular amount of deviation. The system may enable the decoupling of sensitivity to changes from the method of measurement. For example, in a comparative method of measuring overlay, sensitivity may be dependent on where and how overlay is measured. Measuring overlay at one location of an element may be different from measuring overlay at a different location of the same element. Comparative methods may necessarily involve a tradeoff between sensitivity and the ability to create a workable observation interface for the measurement technology used. Some embodiments of the disclosure, however, may reduce or eliminate a tradeoff relationship between sensitivity and requirements for an observation interface. Furthermore, at-resolution overlay measurements of features in semiconductor devices may be enabled.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing systems and methods in systems utilizing electron beams ("e-beams"). However, the disclosure is not so limited. Other types of charged particle beams may be similarly applied. Furthermore, systems and methods for wafer inspection or overlay measurement may be used in other imaging systems, such as optical imaging, photon detection, x-ray detection, ion detection, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C. Expressions such as "at least one of" do not necessarily modify an entirety of a following list and do not necessarily modify each member of the list, such that "at least one of A, B, and C" should be understood as including only one of A, only one of B, only one of C, or any combination of A, B, and C. The phrase "one of A and B" or "any one of A and B" shall be interpreted in the broadest sense to include one of A, or one of B.

Reference is now made to FIG. 1A, which illustrates a substrate 100 that may be used for wafer inspection, consistent with embodiments of the present disclosure. As shown in FIG. 1A, substrate 100 may include an insulating layer 101 on top of abase layer 102. Base layer 102 may include silicon, and insulating layer 101 may include silicon oxide.

Substrate 100 may include elements 110, 120, and 130 formed in insulating layer 101. Elements 110, 120, and 130 may include line elements. FIG. 1A may represent a cross section of substrate 100 wherein some or all of elements 110, 120, and 130 run parallel to one another into and out of the page. Elements 110, 120, and 130 may be floating elements (e.g., they are not directly electrically connected to other elements). For example, elements 110, 120, and 130 may be relatively short rather than being so long as to be effectively grounded. Substrate 100 may include grounded elements G1 and G2. Grounded elements G1 and G2 may be connected to a ground, or may be so large as to effectively act as a ground themselves. In some embodiments, grounded elements G1 and G2 may be part of a larger ground plane structure.

Elements may be formed in substrate 100 according to a predetermined design. The elements may be formed with a predetermined size and at a predetermined location. For example, each of elements G1, G2, 110, 120, and 130 may have a designated width, thickness, and material type. The elements may be formed so as to be centered on respective axes. For example, grounded element G1 is designed to be centered on axis 141, element 120 is designed to be centered on axis 121, element 110 is designed to be centered on axis 111, element 130 is designed to be centered on axis 131, and grounded element G2 is designed to be centered on axis 151.

In some embodiments, elements may at least partially overlap with one another. For example, as shown in FIG. 1A, element 110 may overlap with elements 120 and 130 in an up-down direction. When substrate 100 is viewed in a plan view, element 110 may be over top of at least portions of elements 120 and 130. In some embodiments, elements may not overlap with one another.

At their nominal positions, the elements may be capacitively coupled to one another. As shown in FIG. 1A, there may be a capacitance C1 between element 110 and element 120, a capacitance C2 between element 120 and grounded element G1, a capacitance C3 between element 110 and element 130, and a capacitance C4 between element 130 and grounded element G2. Substrate 100 may be configured such that capacitances C1 and C3 are equal. Also, capacitances C2 and C4 may be equal. In some embodiments, capacitances C1, C2, C3, and C4 may be equal.

In a nominal state, capacitances may be balanced pairwise among the elements. For example, elements G1, 110, 120, 130, and G2 may be formed at their respective axes and capacitances C1, C2, C3, and C4 may be equal. Substrate 100 may have a predetermined arrangement. For example, substrate 100 may be symmetric. As shown in FIG. 1A, substrate 100 may be designed to be mirror symmetric across axis 111. Other types of symmetry may be used such that capacitances are balanced at a nominal arrangement.

Although the drawings may show electrical equivalents of certain elements, it will be appreciated that various structures or geometries may be used to achieve the desired electrical behavior. For example, it will be understood that elements 110 and 120 may be capacitively coupled to one another by way of being separated from one another by an insulating material.

Figure 1B:
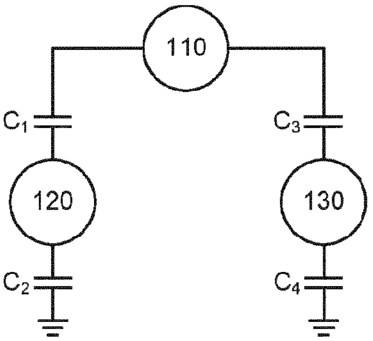
FIG. 1B illustrates a diagrammatic representation of substrate 100, consistent with embodiments of the disclosure.

FIG. 1B illustrates a diagrammatic representation of substrate 100, consistent with embodiments of the disclosure.

In some embodiments, element 110 may include a charge injection element. Element 110 may be configured to receive an external bias (e.g., charge) so as to enable voltage contrast imaging. Element 110 may be configured to receive irradiation from a charged particle beam (e.g., an electron beam). As shown in FIG. 1A, electron beam E may be aligned with axis 111 and projected onto substrate 100. Furthermore, measurement beams $M_1$ and $M_2$ may be aligned with axis 121 and axis 131, respectively, and projected onto substrate 100. Substrate 100 may be used together with a voltage contrast imaging system to measure a voltage ratio (e.g., a voltage balance or imbalance).

When an element is displaced relative to its nominal location (e.g., because of an error in a manufacturing process, a scaling error, etc.), a capacitance imbalance may develop. For example, as shown in FIG. 1A, element 130 may be displaced by Δx to a displaced location 130'. As element 130 moves closer to grounded element G2 and further away from element 110, values of capacitances C1, C2, C3, and C4 may change.

Overlay measurements may be determined from capacitance imbalances. Capacitance may be related to voltage. For example, some elements may follow the basic relationship of q=CV representing the self capacitance of a conductor where q is charge stored, C is capacitance, and V is potential difference across an insulator. In a charged particle beam system (e.g., a SEM imaging system), one or more conducting elements may be provided on a sample comprising an insulating layer. A charged particle beam may probe an area on the sample, and the area may become charged. A surface potential may develop as a charged particle beam irradiates the area and causes secondary charged particles to be emitted from the area. Some charges may accumulate on the sample while some charges are released from the sample as secondary charged particle emission. The surface potential may represent the net charge of the sample, and the surface potential may correspond to a capacitance of an element in the area. A voltage contrast method may involve inducing a known amount of charge. Thus, measured voltage of an element may be representative of capacitance between it and another element.

A measurement method may involve using charged particle beams to perform voltage contrast imaging. Voltage contrast may be used to measure voltages of various elements of substrate 100. Charged particle beams may be projected onto three different locations of substrate 100. In some embodiments, a plurality of beams (e.g., beamlets of a multi-beam apparatus) may be used. In some embodiments, a beam from a single beam apparatus may be used that is projected onto different locations of substrate 100 at different times.

Electron beam E and measurement beams $M_1$ and $M_2$ may be the same beam from a single beam apparatus that is projected onto different locations of substrate 100 at different times. In some embodiments, electron beam E and measurement beams $M_1$ and $M_2$ may be separate beamlets of a multi-beam apparatus. As a beam irradiates a location of substrate 100, secondary charged particles may be generated from the irradiated location of substrate 100 and may be collected at a detector. Detected charged particles may be used for voltage contrast imaging.

The behavior of a particular structure may be modeled so that measured voltages correspond to overlay measurements. For substrate 100 that is shown in FIG. 1A, capacitance may be a function of displacement with respect to a nominal (e.g., symmetric) arrangement. Substrate 100 may follow the following relationship, where ΔC is capacitance imbalance, K' is a proportionality factor, and OV is overlay (e.g., displacement with respect to a nominal arrangement):

$$\Delta C = K'OV \tag{1}$$

A value of 0 for overlay OV may represent that elements are properly aligned and there is no overlay error. A value of capacitance imbalance ΔC may also be 0, indicating that capacitances are balanced. That is, a capacitance ratio may be one-to-one. In some embodiments, a detailed representation (e.g., a specific equation) may depend on the detailed geometry of the substrate. The substrate may be configured to have a balanced geometry in a nominal position. For example, conductive elements on one side of the substrate may be balanced with conductive elements on another side of the substrate. A shift in position of one or more elements may lead to a change in capacitance that has an opposite sign.

As shown with dashed lines in FIG. 1A, an element may displace from a nominal position by Δx. A value of Δx may correspond to overlay OV. For a shift of a bottom structure with respect to a top structure, capacitances may change as:

$$C_1' = C_1^0 + K'OV \tag{2}$$

$$C_2' = C_2^0 - K'OV \tag{3}$$

$$C_3' = C_3^0 - K'OV \tag{4}$$

$$C_4' = C_4^0 + K'OV \tag{5}$$

With all four nominal capacitances being equal, the following relationship may be used, where $V_{diff}$ is a potential difference that may be determinable by performing voltage contrast imaging:

$$V_{diff} = \frac{4K'}{C^0}OV \tag{6}$$

In some embodiments, $V_{diff}$ may also correspond to a grey value difference. Using substrate 100 with a voltage contrast method, charge may be injected into element 110 through a first electron beam. The resulting voltage on elements 120 and 130 may be measured using voltage contrast.

In the arrangement shown in FIG. 1A, a shift of elements 120 and 130 together with respect to elements 110, G1, and G2 may lead to changes in the capacitances and may create a form of capacitance bridge. Using a first order approximation, a shift in one direction will increase C1 and C4, while decreasing C2 and C3. A shift in the opposite direction will have the opposite effect. As a result of the change in capacitances, the voltage measured will change in proportion to the relative shift between elements.

As shown in FIG. 1A, element 110 may be formed in one layer while elements 120 and 130 are formed in another layer. Grounded elements G1 and G2 may be formed in the same layer as element 110. Further variations may include forming grounded elements G1 and G2 in a different plane; forming all of elements G1, G2, 110, 120, and 130 in a single layer or in different layers; forming elements 120 and 130 in un upper layer and element 110 in a lower layer; and any other permutation. Elements G1, G2, and 110 may be manufactured in one step; while elements 120 and 130 are manufactured in a second step; or vice versa. In some embodiments, a grounded element may be connected to element 110. For example, a grounded element may be provided below element 110.

Figure 2A:
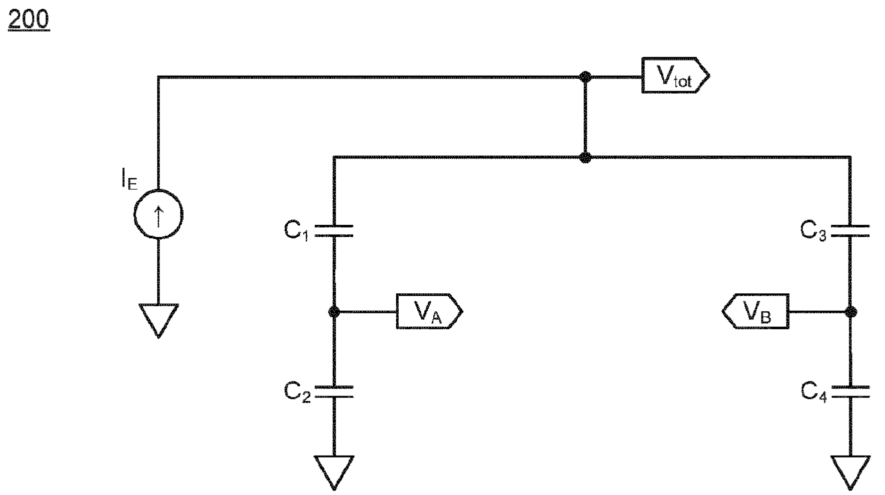
FIG. 2A is a diagrammatic representation of a circuit 200 for performing voltage ratio measurements, consistent with embodiments of the disclosure.
Figure 2B:
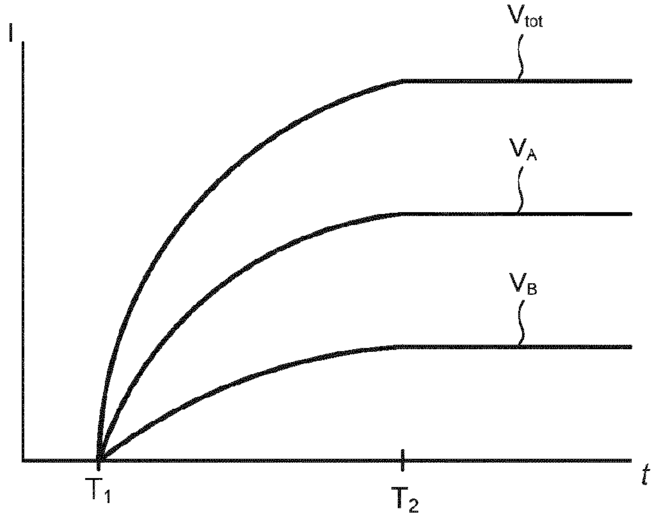
FIG. 2B is a diagrammatic representation of a simulated result of voltage ratio measurements using a circuit, consistent with embodiments of the present disclosure.

FIG. 2A is a diagrammatic representation of a circuit 200 for performing voltage ratio measurements, consistent with embodiments of the disclosure. FIG. 2B may represent a simulated result of voltage ratio measurements using circuit 200. On the graph of FIG. 2B, the horizontal axis represents time, and the vertical axis represents voltage.

As shown in FIG. 2A, a charge injection beam with a specified current may be used. Some current may be lost by emission of charged particles from the surface of the sample. Net current flowing through the system may be represented by a value $I_E$. The charge injection beam may correspond to beam E shown in FIG. 1A that is applied to element 110 of substrate 100. Charge may be injected beginning at time $T_1$ and may last until time $T_2$. Measurement voltages may be measured between C1 and C2, and between C3 and C4 (e.g., at elements 120 and 130, respectively). As shown in FIG. 2B, voltages $V_A$ and $V_B$ are different, indicating a voltage imbalance and thus a capacitance imbalance. The imbalances may be quantitatively determined according to a model corresponding to substrate 100 and the particular measurement conditions. Based on the imbalance, overlay measurements may be determined. $V_{diff}$ may be determined as being equal to the voltage difference $V_A$ minus $V_B$.

A model may be determined by calibration, such as by experiment, or by simulation. In some embodiments, a model may encompass a linear response region. For example, as shown in FIG. 2B, measured voltages (and their difference) may increase approximately linearly with time between times $T_1$ and $T_2$. Time may correspond to current dose. A proportionality factor may be found to correlate dose to measured voltage difference. Overlay may be determined based on the measured voltage difference and proportionality factor. In some embodiments, measurement behavior may not be entirely linear. However, a factor may be determined that models behavior at least over a certain range, for example. The factor may correspond to a range where behavior is substantially linear.

In some embodiments, a model may take into account leakage currents. For example, some structures may exhibit leakage currents that may impact measured voltages $V_A$ and $V_B$. There may additionally be provided a leakage path from a point where $V_A$ is measured to ground (that may be represented by a resistor), and a leakage path from a point where $V_B$ is measured to ground (that may be represented by a resistor). Such leakage paths may cause effects of reduced amplitudes and of voltage bias falling off rapidly after reaching a charged state. Effects may depend on the speed at which charge leaks away from measurement parts.

Figure 3A:
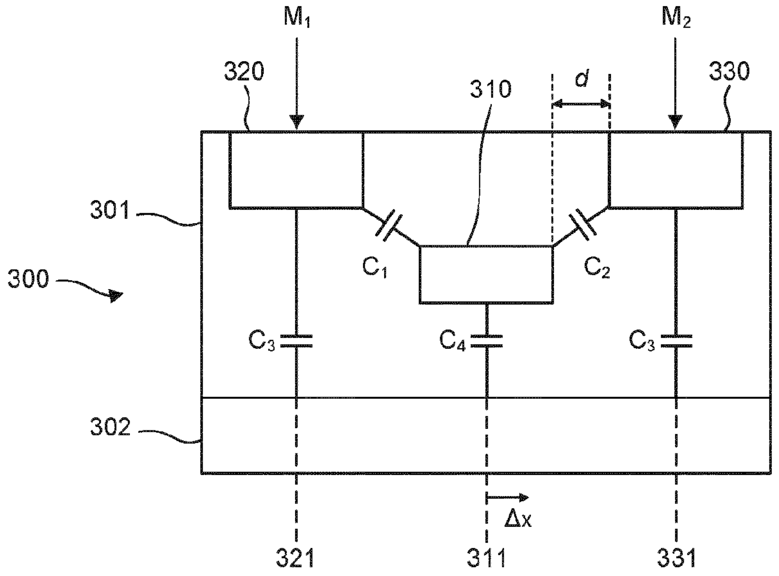
FIG. 3A illustrates a substrate that may be used for wafer inspection, consistent with embodiments of the present disclosure.

Reference is now made to FIG. 3A, which illustrates a substrate 300 that may be used for wafer inspection, consistent with embodiments of the present disclosure. Substrate 300 may be similar to substrate 100 except for certain differences. For example, the ground plane may be represented by a single plane of base layer 302. Furthermore, an arrangement of floating elements may be modified.

As shown in FIG. 3A, substrate 300 may include an insulating layer 301 on top of a base layer 302. Substrate 300 may include elements 310, 320, and 330 formed in insulating layer 101. Elements 310, 320, and 330 may include line elements (e.g., conducting lines). Some or all of elements 310, 320, and 330 may run parallel to one another into and out of the page.

Elements 310, 320, and 330 may be capacitively coupled to one another. There may be a capacitance C1 between elements 310 and 320. There may be a capacitance C2 between elements 310 and 330. Furthermore, there may be a capacitance C3 between the ground plane and each of elements 320 and 330. There may be a capacitance C4 between the ground plane and element 310.

Elements 320 and 330 may be configured to receive irradiation from a charged particle beam. As shown in FIG. 3A, measurement beams $M_1$ and $M_2$ may be aligned with axis 321 and axis 331, respectively, and projected onto substrate 300. Substrate 300 may be used together with a voltage contrast imaging system to measure a voltage ratio. Different from FIG. 1A, in FIG. 3A, there is no electron beam E that is used for exciting a charge injection element.

In some embodiments, substrate 300 may be configured so that the following condition is satisfied: C1>>C3. Also, the following condition may be satisfied: C2>>C3. Accordingly, C3 may be so small as to be ignored. The same may apply to C4.

The behavior of a structure including a substrate may be modeled so that measured voltages correspond to overlay measurements. For substrate 300 that is shown in FIG. 3A, capacitance may be a function of displacement with respect to a nominal (e.g., symmetric or balanced) arrangement.

The difference in measured voltages of elements 320 and 330 via measurement beams M1 and M2 may relate to the difference in capacitances C1 and C2. The difference in capacitances may relate to overlay. A method of determining an overlay measurement may include measuring voltages of first and second elements and determining a ratio capacitances.

For relationships such as equations (1) through (6), a proportionality factor may be determined experimentally or by simulation, for example. The proportionality factor may be based on information about the structure under observation, operating conditions of a voltage contrast imaging system, or other parameters relating to measurement of overlay.

Figure 3B:
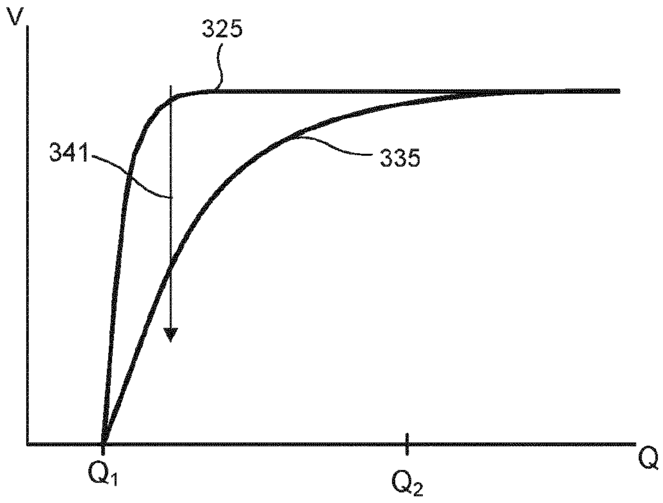
FIGS. 3B and 3C are diagrammatic representations of behavior of structures undergoing overlay measurement, consistent with embodiments of the disclosure.
Figure 3C:
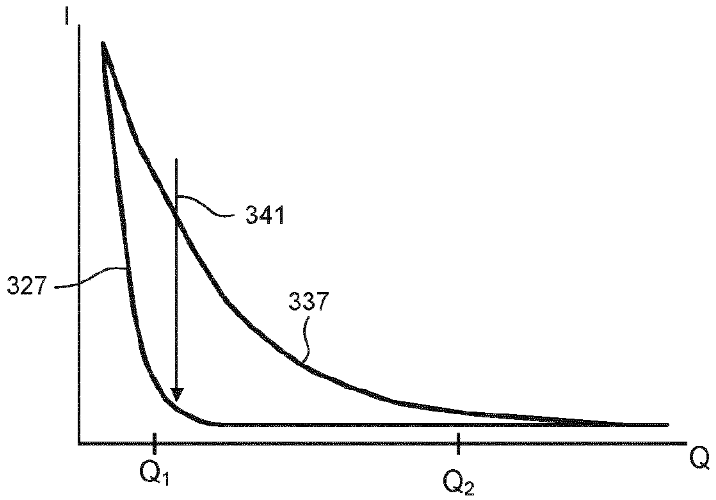

FIG. 3B and FIG. 3C are diagrammatic representations of behavior of structures undergoing overlay measurement, consistent with embodiments of the disclosure. In FIG. 3B, the horizontal axis may represent charge density and the vertical axis may represent surface potential. Charge density may correspond to a measurement dose applied to an element on substrate 300. The graph of FIG. 3B may represent measurement behavior of substrate 300 by applying measurement beams $M_1$ and $M_2$. Curves shown in the graph may be different from one another when an overlay error occurs (e.g., an arrangement of elements deviates from a predetermined arrangement, such as symmetric). For example, curves may be different when element 310 is displaced relative to axis 311 (see FIG. 3A). Element 310 may be shifted away from axis 311 by displacement $\Delta x$. Element 310 may be further away from element 320 and closer to element 330, and values of capacitances C1 and C2 may change. For example, a smaller capacitance may result in faster charging than a large capacitance. Curve 325 may represent the measured surface potential of element 320 using measurement beam $M_1$ and curve 335 may represent the measured surface potential of element 330 using measurement beam $M_2$. Arrow 341 represents a trend of increasing capacitance. Curve 325 may represent a small capacitance and curve 335 may represent a large capacitance. When capacitances between pairs of elements are equal (e.g., when C1=C2, also meaning that a capacitance ratio is one-to-one), curves 325 and 335 may overlap with one another. Overlapping curves may indicate that there is no overlay error (e.g., that structures are formed in a symmetric arrangement).

FIG. 3C may represent another form of data collected from measurement results using measurement beams $M_1$ and $M_2$ on substrate 300. In FIG. 3C, the horizontal axis may represent charge density and the vertical axis may represent secondary charged-particle current detected at a detector divided by primary beam current. The vertical axis may correspond to grey level of features imaged by voltage contrast. Charge density may correspond to measurement dose.

Similar to FIG. 3B, curves in FIG. 3C may be different when overlay error occurs. In FIG. 3C, curve 327 may represent the measured grey value of element 320 using measurement beam $M_1$ and curve 337 may represent the measured surface potential of element 330 using measurement beam $M_2$. Arrow 341 represents a trend of decreasing capacitance. Curve 327 may represent a small capacitance and curve 337 may represent a large capacitance. When capacitances between pairs of elements are equal (e.g., when C1=C2), curves 327 and 337 may overlap with one another. Overlapping curves may indicate that there is no overlay error (e.g., that structures are formed in a symmetric arrangement).

As shown in FIG. 3B and FIG. 3C, there may be a range of measurement dosage where differences between measured elements are exhibited. For example, as shown in FIG. 3B, there may be a range between a first measurement dose $Q_1$ and a second measurement dose $Q_2$ where values of curves 325 and 335 are different from one another. Values of curves 325 and 335 may converge as charging continues. An optimal range of dosage may be determined that enables transient behavior of capacitance imbalances to be exposed. When a structure is in a predetermined arrangement (e.g., symmetric), measured values of surface potential or grey level may be the same from one element to another, even in a region of transient behavior. However, when structures deviate from the predetermined arrangement (e.g., due to an overlay error), measured values of surface potential or grey level may differ from one element to another in the region of transient behavior.

Figure 3D:
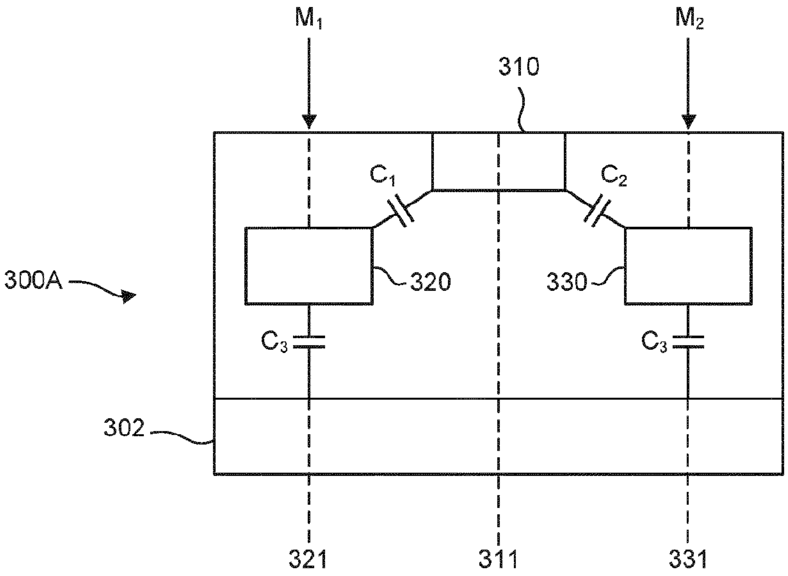
FIG. 3D illustrates a substrate that may be used for wafer inspection, consistent with embodiments of the present disclosure.

FIG. 3D illustrates another example substrate 300A that may be used for wafer inspection, consistent with embodiments of the present disclosure. Substrate 300A may be similar to substrate 300 except for certain differences. For example, there may be one upper element and two lower elements.

Substrates 300 and 300A may each have a predetermined arrangement. For example, in a nominal state, there may be mirror symmetry across axis 311. When structures deviate from the predetermined arrangement (e.g., when one or more of elements 310, 320, and 330 shift to the left or right), capacitance imbalances may become detectable. Based on measured capacitances (e.g., determined through voltage contrast imaging), an overlay measurement may be determined.

In some embodiments, correspondence between measured values in a structure and overlay measurements may be determined. The link between measured voltage differential and overlay (e.g., displacement $\Delta x$, or OV) may depend on capacitance of various elements in the structure (e.g., C1, C2, C3), and a proportionality constant. In some embodiments, a proportionality constant may be calculated. In some embodiments, a calibration method may be used. For substrate 300A as may be shown in FIG. 3D, $V_{diff}$ may be determined as the voltage difference between the voltage detected from M1 and the voltage detected from M2.

Figure 4A:
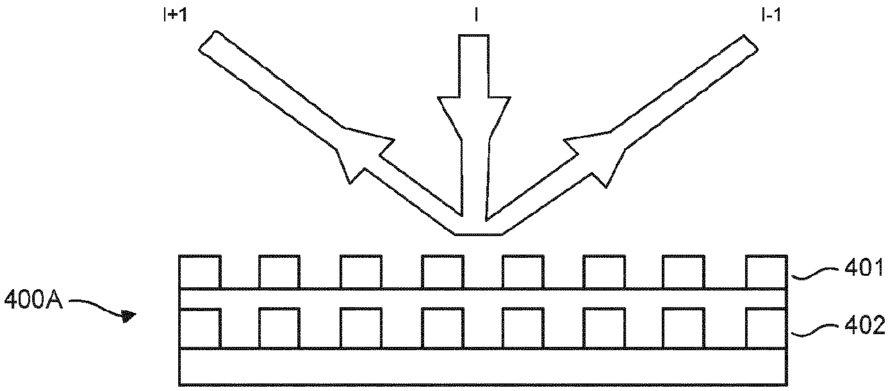
FIGS. 4A-4D illustrate exemplary gratings that may be used for calibration, consistent with embodiments of the disclosure.
Figure 4B:
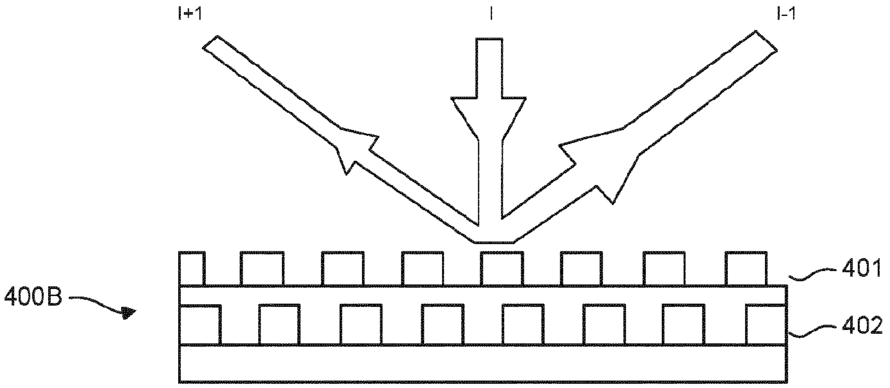

Reference is now made to FIGS. 4A-4D, which illustrate exemplary gratings that may be used for calibration, consistent with embodiments of the disclosure. As shown in FIG. 4A and FIG. 4B, overlay may be measured using an incident beam I and resultant beams $I_{-1}$ and $I_{+1}$. In some embodiments, optical methods employing light beams may be used. When there is no overlay error, measured intensity of $I_{-1}$ and $I_{+1}$ may be equal. FIG. 4A shows a situation of OV=0 and $A=I_{+1}-L_{-1}=0$, where OV is overlay and A is a measurement value based on a charged particle beam. Incident beam I may be projected on a grating structure 400A that comprises first layer structures 401 and second layer structures 402. First layer structures 401 and second layer structures 402 are stacked exactly on top of one another and there is no overlay error. As a result of interaction with grating structure 400A, resultant beams $I_{-1}$ and $I_{+1}$ are generated that are equal in intensity.

On the other hand, when an overlay error is present (e.g., gratings are not stacked exactly on top of one another), an incident beam may interact with the grating differently, and result beams may be generated asymmetrically. FIG. 4B shows a situation of OV≠0 and $A=I_{+1}-I_{-1}=K\times OV$, where OV is overlay, A is a measurement value based on a charged particle beam, and K is a proportionality factor. Incident beam I may be projected on a grating structure 400B that comprises first layer structures 401 and second layer structures 402. First layer structures 401 and second layer structures 402 are offset from one another. Thus, there is an overlay error. As a result of interaction with grating structure 400B, resultant beams $I_1$ and $I_{+1}$ are generated that are not equal in intensity.

In methods based on capacitance imbalance, there may be an a-priori unknown proportionality factor K. Factor K may be modeled based on characteristics of the system and measurement conditions, for example.

To eliminate a process-dependent proportionality factor K, double-biased overlay measurements may be used. Factor K may be extracted by using a combined measurement on two overlay targets, with a built-in but opposed bias d. Two targets with opposite bias may allow extraction of the overlay value and the proportionality factor K. A method of calibrating an overlay measurement system may comprise using two targets with opposite bias. The method may include determining an overlay using a first measurement result of a first target and a second measurement of a second target. The bias may be known in advance.

Figure 4C:
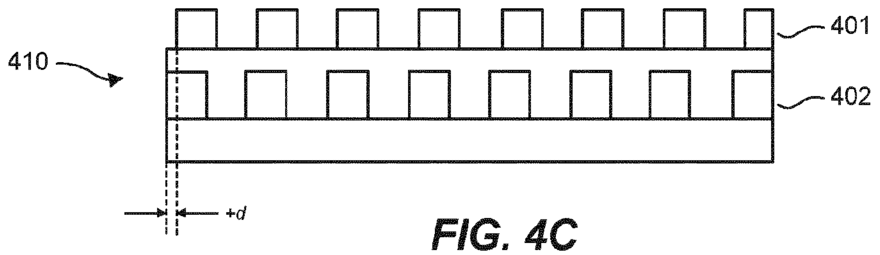
Figure 4D:
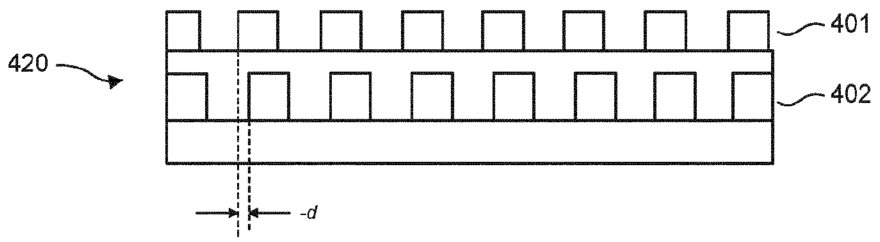

FIG. 4C illustrates a first grating 410 that is biased in a first direction. As shown in FIG. 4C, first layer structures 401 are offset from second layer structures 402 by positive bias d. FIG. 4C shows a situation of OV=d and $A_+=K(OV+d)$. On the other hand, FIG. 4D illustrates a second grating 420 that is biased in a direction opposite to the first direction. As shown in FIG. 4D, first layer structures 401 are offset from second layer structures 402 by negative bias −d. FIG. 4D shows a situation of OV=−d and $A_-=K(OV-d)$. Using first grating 410 and second grating 420, overlay may be measured without dependence on proportionality factor K. For example, combining measurements from first grating 410 and second grating 420, the following relationship may be found:

$$OV = d\frac{A_+ + A_-}{A_+ - A_-} \quad (7)$$

From the above, bias d may be determined by a mask wafer. Furthermore, values of A (e.g., A_ and $A_+$) may be accurately measured by a metrology tool. "A" may represent a measurement result, such as voltage contrast imaging results, grey level, etc.

In some embodiments, overlay may be determined from a voltage imbalance according to an equation such as the following, with the sign relating to the direction of the built-in bias d of the overlay target as shown in FIG. 4C and FIG. 4D:

$$OV = d\frac{V_{diff}^{+} + V_{diff}^{-}}{V_{diff}^{+} - V_{diff}^{-}} \quad (8)$$

In some embodiments, overlay may be measured using two measurements: one with a first bias and another with an opposite bias. The bias may be known in advance. The two measurements may be combined so as to eliminate any dependence on a proportionality factor to correlate measured values to overlay. For example, measured values of intensity of charged particles collected on a detector may be used directly together with a known bias term to obtain a value of overlay.

In some embodiments, layout of elements in a substrate may be optimized. Optimization may be done for charging efficiency or measurement efficiency. For example, for enhanced compatibility with electron beam scanning, a target's geometry may be optimized to separate the location of a charging scan and the location of a measurement scan. Although "scanning" is discussed herein, it will be appreciated that a charged particle beam need not constantly move across the surface of a sample. In some embodiments, a charged particle beam may be projected on one or more particular locations and may be turned off (e.g., blanked away from the sample) when not in use. Dosage on an element of a substrate may be determined by the dwell time of the charged particle beam on the element.

A charged particle beam device may be provided that is configured to charge a substrate. The substrate may include a first element, a second element, and a third element that are configured to be arranged symmetrically in the substrate. For example, as shown in FIG. 1A, there may be provided substrate 100 having a first element (110), a second element (120), and a third element (130). Also, as shown in FIG. 3A, there may be provided substrate 300 having a first element (310), a second element (320), and a third element (330). The elements may be arranged symmetrically, such as by having mirror symmetry. In some embodiments, symmetry may also be achieved by having another type of balanced arrangement, such as that shown in FIG. 7.

A capacitive coupling may be formed between the first element and the second element, and between the first element and the third element. For example, as shown in FIG. 1A, there may be capacitance C1 between element 110 and element 120, and capacitance C2 between element 110 and element 130. Also, as shown in FIG. 3A, there may be capacitance C1 between element 310 and element 320, and capacitance C2 between element 310 and element 330.

The substrate may be configured such that at least one of the first element, the second element, and the third element are charged by the charged particle beam device to enable determination of an overlay measurement. For example, as shown in FIG. 1A, element 110 may be charged by beam E. Beam E may be generated by a charged particle beam source of the charged particle beam device. The charged particle beam device may include a single beam apparatus or a multi-beam apparatus. Also, as shown in FIG. 3A, element 320 or element 330 may be charged by measurement beams M1 and M2, respectively. The substrate may be configured such that when the first through third elements become asymmetric, a capacitance imbalance is formed. Overlay may be determined through the capacitance imbalance.

The charged particle beam source may include a detector configured to collect secondary charged particles emitted from the substrate. The secondary charged particles may include secondary or backscattered electrons that may be emitted from the substrate due to irradiation of a beam of the charged particle beam source. The secondary charged particles may indicate a capacitance ratio between a first pair of elements and a second pair of elements among the first through third elements. The charged particle beam source may also include an electronic control unit (ECU) configured to determine an overlay measurement based on the capacitance ratio. The electronic control unit may include a memory and a processor.

Figure 5A:
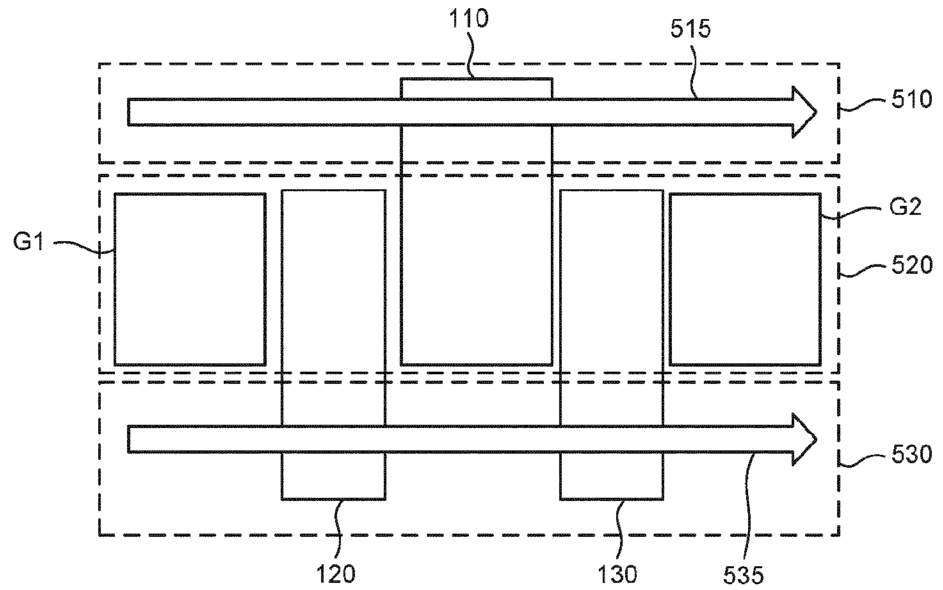
FIGS. 5A and 5B are diagrammatic representations of layouts of substrates for overlay measurement, consistent with embodiments of the disclosure.
Figure 5B:
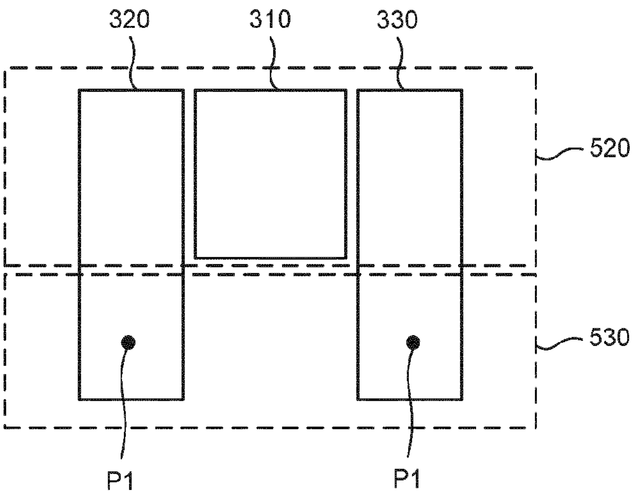

Reference is now made to FIG. 5A and FIG. 5B, which are diagrammatic representations of layouts of substrates for overlay measurement, consistent with embodiments of the disclosure. FIG. 5A may represent a plan view of substrate 100 that is shown in FIG. 1A. FIG. 5B may represent a plan view of substrate 300 that is shown in FIG. 3A.

As shown in FIG. 5A, there may be a charge injection region 510, an interaction region 520, and a measurement region 530. Regions 510, 520, and 530 may be parts of a top view of substrate 100. Charge injection region 510 may designate a location where a charged particle beam may irradiate part of the substrate under which element 110 is located. The charged particle beam may follow scan path 515. The charged particle beam may interact with the substrate and charge may be injected into element 110. In interaction region 520, elements 110, 120, 130, G1, and G2 may interact with one another by capacitive coupling. Measurement region 530 may designate a location where a charged particle beam may irradiate part of the substrate under which elements 120 and 130 are located. The charged particle beam may follow scan path 535. The charged particle beam used in measurement region 530 may be the same as that used in charge injection region 510. The charged particle beam may irradiate different locations at different times. Irradiating measurement region 530 may coincide with performing voltage contrast imaging of the substrate. Voltage may be read for a particular element (e.g., a voltage measurement for element 120 or element 130) and correlated with a single scan-in-time. Beam current of the charged particle beam may be adjusted according to its application. In some embodiments, multiple charged particle beams may be used. For example, beamlets of a multi-beam system may be projected onto the substrate to irradiate each of elements 110, 120, and 130 at once.

Interaction region 520 may include elements for forming capacitive couplings. Elements may overlap with one another in interaction region 520. In FIG. 5A, grounded elements G1 and G2 may be used together with elements 120 and 130, respectively, to form capacitances C2 and C4 (see FIG. 1A). In FIG. 5B, the ground plane may be formed by the underlying base layer (e.g., silicon) below all of elements 310, 320, and 330.

In some embodiments, a charge injection region may be omitted. FIG. 5B shows interaction region 520 and measurement region 530. In some embodiments, a charged particle beam may scan over a region and current dosage may be determined by the time that the beam was projected on top of particular elements (e.g., the dwell time). Dosage may be adjusted by adjusting scanning speed or beam current, for example. In some embodiments, the charged particle beam may be directed to a particular location and may irradiate that location without moving. For example, as shown in FIG. 5B, there may be a first measurement point P1 and a second measurement point P2. The charged particle beam may be used to irradiate the substrate by only being projected on points P1 and P2. In some embodiments, separate charged particle beams may be used to irradiate different points.

In some embodiments, injection region 510, interaction region 520, or measurement region 530 may be physically spaced apart from one another in plan view of the substrate. Separation between footprints (e.g., interaction footprint and measurement footprint) may enable advantages such as further optimization and customization. For example, elements that provide overlay sensitivity (e.g., elements 110, 120, 130, G1, G2, 310, 320, or 330) may be engineered separately from injection or measurement parts of the substrate. Such elements may be electrically coupled. Thus, the footprint of various sections may be optimized to the specific needs of particular applications.

Separation between measurement region 530 and interaction region 520 may enable optimization of interaction region 520. Interaction region 520 may be optimized according to various criteria, including those that may not necessarily be related to overlay. Optimization may be based on geometrical or electrical parameters. Criteria may include: line edge roughness, critical dimension, or leakage current. On the other hand, input and output parts of the substrate (e.g., injection region 510 and measurement region 530) may require only few criteria to support measurement of capacitance imbalances for overlay, leaving substantial flexibility for optimization of other parts of the substrate based on other criteria. Furthermore, in some embodiments, injection region 510 and measurement region 530 may be located in different layers, further enhancing flexibility and customizability. For example, metal vias may be provided to move injection region 510 or measurement region 530 to different layers of the substrate.

In some embodiments, overlay measurement may be performed on targets having compatible structures thereon. Targets may include dedicated targets used for overlay, alignment, critical dimension, or any measurement. In some embodiments, targets need not necessarily be structures that are intended to be used as dedicated targets. Targets may include structures that are part of functional components of IC chips.

Variations of structures that may be used for overlay measurement may include: elements in various layers, in-plane geometry, or angled structures. Furthermore, a multiplicity of elements may be provided. Also, measurements may be used to determine changes in material thickness or permittivity for a dielectric.

For example, as discussed above with reference to FIG. 1A, rather than providing a charge injection element in an upper layer, the charge injection element may be provided in a different layer. For example, the charge injection element may be provided in a lower layer. Measurement elements may be provided on top of charge injection elements. In some embodiments, measurement elements may be provided side-by-side with respect to charge injection elements. Moreover, while FIG. 1A illustrates five elements (e.g., elements 110, 120, 130, plus grounded elements G1 and G2), other numbers of elements may be used. For example, additional charge injection elements and measurement elements may be interposed between grounded elements and other structures.

Interdigitated variants may also be used. Elements may include lines that may have a longitudinal direction. The lines may follow the longitudinal direction, even though the longitudinal direction may not necessarily be a straight line. A wiring path may meander, for example. Nevertheless, multiple elements may remain parallel to one another at various positions along the longitudinal direction. At any given cross section, for example, elements may be configured to maintain a nominal spacing.

Figure 6:
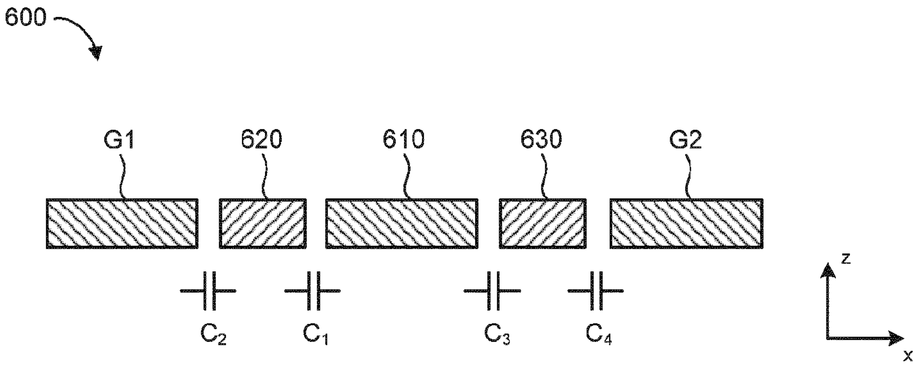
FIG. 6 illustrates a substrate with in-plane geometry, consistent with embodiments of the disclosure

FIG. 6 illustrates a substrate 600 with in-plane geometry, consistent with embodiments of the disclosure. Substrate 600 may include element 610 that may act as a charge injection element. Substrate 600 may also include elements 620 and 630 that may act as measurement elements. Furthermore, substrate 600 may include grounded elements G1 and G2. Capacitances between elements may be formed in the lateral direction. FIG. 6 shows an exemplary coordinate axis of z and x-directions. The z-direction may be a thickness direction of substrate 600. X and y-directions may be lateral (horizontal) directions.

Performing overlay measurements may involve measuring voltage contrast of elements 620 and 630. Deviation from a predetermined arrangement, such as that shown nominally in FIG. 6, may result in a capacitance imbalance that is detectable by measuring voltage of elements 620 and 630. A nominal state of substrate 600 may have left-to-right symmetry (e.g., along the x-direction). An axis of symmetry may be a line in the z-direction that intersects the midpoint of element 610.

Figure 7:
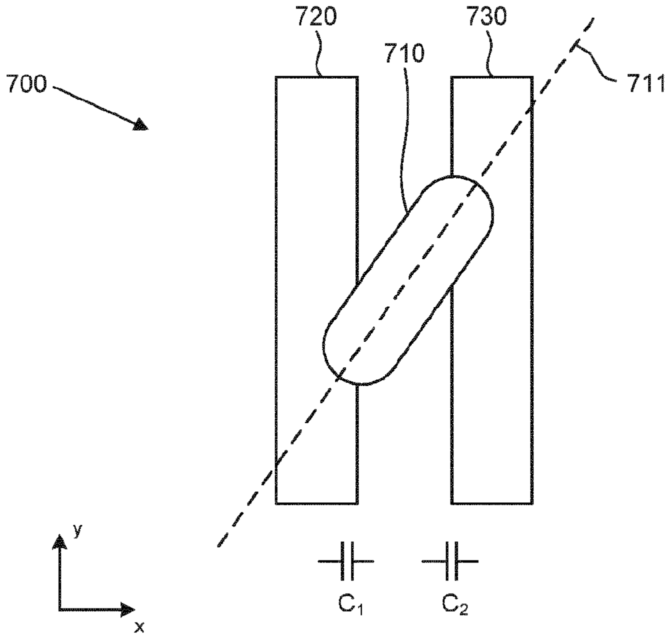
FIG. 7 illustrates a substrate with angled structures, consistent with embodiments of the disclosure.

FIG. 7 illustrates a substrate 700 with angled structures, consistent with embodiments of the disclosure. Substrate 700 may include elements 710, 720, and 730. Elements 720 and 730 may act as measurement elements. A predetermined arrangement of substrate 700 may be that shown in FIG. 7. The predetermined arrangement may include rotational symmetry. Element 710 may nominally be aligned with an axis 711. Element 710 may be configured to have a predetermined overlap with respect to elements 720 and 730. The amount of overlap with element 720 may be equal to the amount of overlap with element 730.

In the arrangement of substrate 700, capacitance between element 710 and element 720 (e.g., C1) and capacitance between element 710 and element 730 (e.g., C2) may be proportional to the geometric overlap among elements. In a nominal arrangement, a ratio of C1 to C2 may be one-to-one. As element 710 deviates from its nominal position, the amount of overlap between element 710 and element 720 may change in an opposite way from the amount of overlap between element 710 and element 730. An imbalance in capacitance may be generated as the amount of overlap changes. Overlay may be determined from a capacitance ratio (e.g., a balance or imbalance).

Element 710 may deviate from its nominal position by translating along axis 711. Translation along axis 711 may result in different amounts of overlap with elements 710 and 720. In some embodiments, element 710 may shift in the x-direction. Shifting of element 710 along the y-direction will not necessarily cause a difference in the amount of overlap. Substrate 700 may be sensitive to shifting of element 710 in the x-direction but not purely in the y-direction. When elements 720 and 730 are very long, translation may be invariant in the y-direction.

Grounded elements may be provided next to elements 720 and 730, or may be provided in a base layer of substrate 700.

Figure 8:
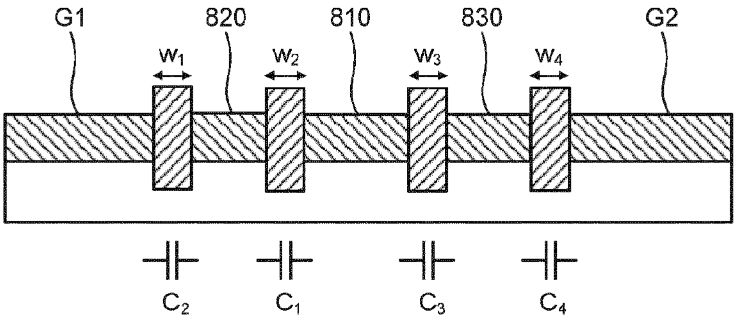
FIG. 8 illustrates a substrate having dielectric portions, consistent with embodiments of the disclosure.

FIG. 8 illustrates a substrate 800 having dielectric portions, consistent with embodiments of the disclosure. Substrate 800 may include elements 810, 820, and 830, and grounded elements G1 and G2. There may also be provided dielectric structures between the elements. Dielectric structures may include lines that separate electrically conductive elements from one another. Dielectric structures may be formed by a litho etch litho etch (LELE) process, double patterning, or any suitable manufacturing process. Substrate 800 may be configured such that dielectric structures are formed with predetermined widths (e.g., widths w1, w2, w3, and w4). Substrate 800 may be configured to have a predetermined arrangement. Substrate 800 may have left-right mirror symmetry. When properties of dielectric structures change asymmetrically, capacitances between elements 810, 820, 830, G1, and G2 may change. For example, when widths w1, w2, w3, or w4 change asymmetrically, a capacitance imbalance will result. Furthermore, when dielectric index of the dielectric structures change asymmetrically, a capacitance imbalance will result. A capacitance imbalance may be detectable from measured voltages. For example, voltages of elements 820 and 830 may be measured and a capacitance imbalance may be determined. The capacitance imbalance may be used to reveal information about the dielectric structures. Furthermore, asymmetric changes with respect to elements 810, 820, and 830 may also be detectable through capacitance imbalances.

Figure 9:
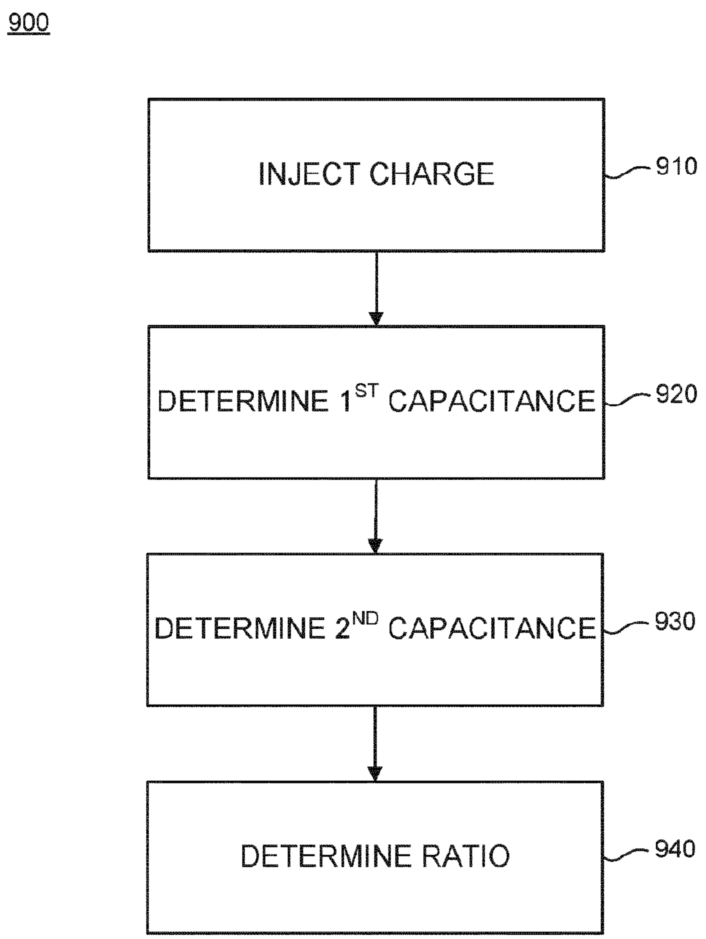
FIG. 9 is a flowchart illustrating a method of determining an overlay measurement, consistent with embodiments of the disclosure.

In some embodiments, there may be provided methods for determining a capacitance ratio (e.g., a balance or imbalance) or determining an overlay measurement. Reference is now made to FIG. 9, which illustrates a first method of determining an overlay measurement, consistent with embodiments of the disclosure.

As shown in FIG. 9, a method 900 may begin with a step 910 of injecting charge into an element of a substrate. Step 910 may include injecting charge into a charge injection element. Step 910 may include irradiating the element with a charged particle beam, such as an electron beam. Step 910 may include irradiating element 110 with beam E as shown in FIG. 1A.

Method 900 may include a step 920 of determining a first capacitance of a first pair of elements. The first pair of elements may include the element into which charge was injected in step 910 and another element, such as a first measurement element. Determining the first capacitance may include performing voltage contrast imaging on an element separate from the element into which charge was injected in step 910. Performing voltage contrast imaging may include using the same or a different charged particle beam from that used in step 910. Determining the first capacitance may include measuring the voltage of the first measurement element. Step 920 may include irradiating element 120 with beam $M_1$, or irradiating element 130 with beam $M_2$, as shown in FIG. 1A. A voltage of the irradiated element may be determined, such as $V_A$ or $V_B$, as shown in FIG. 2B.

Method 900 may include a step 930 of determining a second capacitance of a second pair of elements. The second pair of elements may include the element into which charge was injected in step 910 and another element, such as a second measurement element. Determining the second capacitance may include performing voltage contrast imaging on an element separate from the element into which charge was injected in step 910 and separate from the element measured in step 920. Step 930 may include irradiating the other one of element 120 or element 130 with a beam (e.g., beam $M_1$ or beam $M_2$), as shown in FIG. 1A. A voltage of the irradiated element may be determined, such as the other of $V_A$ or $V_B$, as shown in FIG. 2B. Further determinations of other capacitances may also be performed (such as determining a capacitance between the first measurement element and ground, and determining a capacitance between the second measurement element and ground).

Method 900 may include a step 940 of determining a capacitance ratio based on the determined first and second capacitances. Step 940 may include determining a voltage ratio between the voltage of the first measurement element and the voltage of the second measurement element. Step 940 may include determining the voltage ratio based on a proportionality factor that represents the substrate under inspection and a capacitance value that represents the substrate. The substrate may be configured to have nominal capacitances between elements, and the capacitance value that represents the substrate may include a nominal value. The proportionality factor may be determined by calibration. The proportionality factor may be determined using a biasing method such as that discussed above with respect to FIGS. 4A-4D.

Step 940 may include determining an overlay measurement based on the capacitance ratio. The overlay measurement may correspond to a shift of an element relative to a nominal arrangement of the substrate. The capacitance ratio may include a capacitance imbalance. Step 940 may include determining an overlay error, such as Δx, based on the capacitance imbalance.

Figure 10:
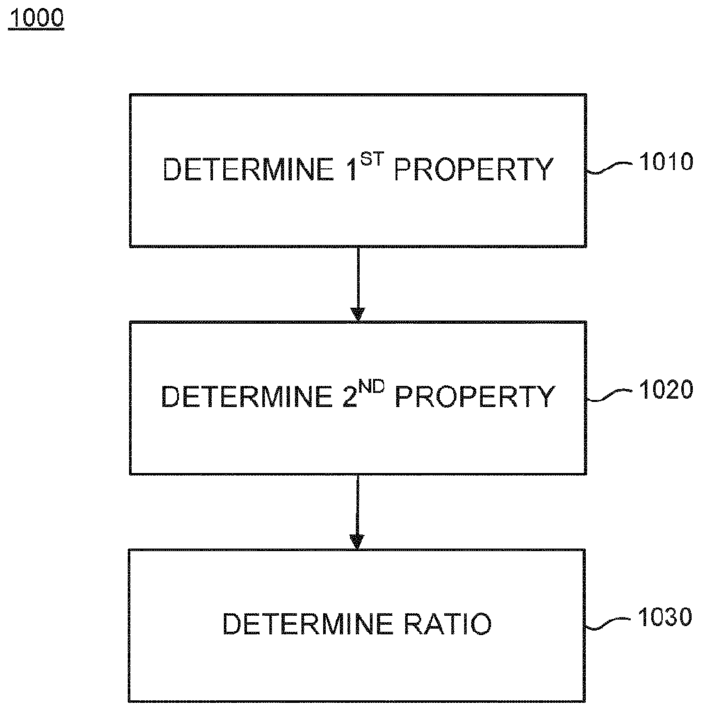
FIG. 10 is a flowchart illustrates a method of determining an overlay measurement, consistent with embodiments of the disclosure.

Reference is now made to FIG. 10, which illustrates a second method of determining an overlay measurement, consistent with embodiments of the disclosure. As shown in FIG. 10, a method 1000 may begin with a step 1010 of determining a first transient property based on a capacitance of a first pair of elements. The first pair of elements may include a central element and another element, such as a first measurement element. For example, the central element may include element 310 and the other element may include element 320 or element 330, as shown in FIG. 3A or FIG. 3B. Determining the first transient property may include determining a surface potential of the first measurement element. Determining the first transient property may include determining a grey level of the first measurement element. The first transient property may be determined within a range of measurement dosages at which capacitance imbalances may be observable, for example as discussed above with reference to FIG. 3B and FIG. 3C. Step 1010 may include performing voltage contrast imaging on the first measurement element. Determining the first transient property may include measuring the voltage of the first measurement element. Step 1010 may include irradiating element 320 with beam $M_1$ or irradiating element 330 with beam $M_2$, as shown in FIG. 3A or FIG. 3B.

Method 1000 may include a step 1020 of determining a second transient property based on a capacitance of a second pair of elements. The second pair of elements may include the central element and another element, such as a second measurement element. Step 1020 may include performing voltage contrast imaging on the second measurement element. Performing voltage contrast imaging may include using the same or a different charged particle beam from that used in step 1010. Step 1020 may include irradiating the other one of element 320 or element 330 with a beam (e.g., beam $M_1$ or beam $M_2$), as shown in FIG. 3A or FIG. 3B. The first transient property and the second transient property may be different from one another when there is a capacitance imbalance between elements. For example, when the central element is displaced relative to a nominal position (e.g., the central element is not equidistant from the first measurement element and the second measurement element but is closer to the first measurement element or the second measurement element), the first transient property and the second transient property may be different from one another in the range of measurement dosages at which capacitance imbalances may be observable. Of course, a capacitance balance may also be found (e.g., when the central element is not displaced relative to the nominal position). A determination of a capacitive ratio may be used to determine overlay. The capacitance between the central element and the first measurement element may be determined. Also, the capacitance between the central element and the second measurement element may be determined. Further determinations of other capacitances may also be performed (such as determining a capacitance between the central element and ground, determining a capacitance between the first measurement element and ground, and determining a capacitance between the second measurement element and ground).

Method 1000 may include a step 1030 of determining a capacitance ratio based on the determined first and second transient properties. The capacitance ratio may include a capacitance imbalance. Step 1030 may include determining that there is an overlay error when the first transient property and the second transient property are different. Step 1030 may include determining an overlay error, such as $\Delta x$.

Other methods consistent with embodiments of the disclosure may include a method of calibration, a method of determining a proportionality constant, a method of modeling a structure for overlay measurement, a method of determining optimal ranges of dosage for performing overlay measurements, a method of charging a substrate using a charged particle beam device, and methods of manufacturing an overlay target, and so on.

A non-transitory computer-readable medium may be provided that stores instructions for a processor of a controller (e.g., a central processing unit or electronic control unit that is configured to control a charged particle beam apparatus) for performing overlay measurement according to the exemplary flowcharts of FIG. 9 or FIG. 10 or other methods consistent with embodiments of the present disclosure. For example, the instructions stored in the non-transitory computer-readable medium may be executed by the circuitry of the controller for performing method 900 or 1000 in part or in entirety. Common forms of non-transitory media include, for example, a floppy disk, a flexible disk, hard disk, solid-state drive, magnetic tape, or any other magnetic data storage medium, a Compact Disc Read-Only Memory (CD-ROM), any other optical data storage medium, any physical medium with patterns of holes, a Random Access Memory (RAM), a Programmable Read-Only Memory (PROM), and Erasable Programmable Read-Only Memory (EPROM), a FLASH-EPROM or any other flash memory, Non-Volatile Random Access Memory (NVRAM), a cache, a register, any other memory chip or cartridge, and networked versions of the same.

Block diagrams in the figures may illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

The embodiments may further be described using the following clauses:

1. A method of determining an overlay measurement of a substrate, the method comprising:
injecting charge into a charge injection element of the substrate;
determining a first capacitance of a first pair of elements and a second capacitance of a second pair of elements;
determining a capacitance ratio based on the first capacitance and the second capacitance; and
determining the overlay measurement based on the capacitance ratio.

2. The method of clause 1, wherein injecting the charge into the charge injection element includes irradiating the charge injection element with a charged particle beam.

3. The method of clause 1 or clause 2, further comprising:
determining the first capacitance as a capacitance between the charge injection element and a first measurement element; and
determining the second capacitance as a capacitance between the charge injection element and a second measurement element.

4. The method of clause 3, further comprising:
performing voltage contrast imaging to determine a first voltage of the first measurement element and a second voltage of the second measurement element.

5. The method of any one of clauses 1-4, further comprising:
determining a voltage ratio based on the first capacitance and the second capacitance.

6. The method of any one of clauses 1-5, further comprising:
determining a proportionality factor that represents the substrate.

7. The method of clause 6, further comprising:
determining the overlay measurement based on the proportionality factor and based on the first capacitance or the second capacitance.

8. The method of clause 1, further comprising:
determining a difference between a grey level of a first measurement element and a grey level of a second measurement element.

9. A method of determining an overlay measurement of a substrate, the method comprising:
determining a first transient property based on a first capacitance of a first pair of elements of the substrate;

determining a second transient property based on a second capacitance of a second pair of elements of the substrate;

determining a capacitance ratio based on the first transient property and the second transient property; and determining the overlay measurement based on the capacitance ratio.

10. The method of clause 9, further comprising:

determining a difference between a surface potential of a first measurement element and a surface potential of a second measurement element.

11. The method of clause 9, further comprising:

determining a difference between a grey level of a first measurement element and a grey level of a second measurement element.

12. The method of clause 10 or clause 11, wherein the first pair of elements includes a central element and the first measurement element and the second pair of elements includes the central element and the second measurement element.

13. The method of any one of clauses 9-12, further comprising:

performing voltage contrast imaging.

14. The method of any one of clauses 9-13, further comprising:

determining the first capacitance or the second capacitance.

15. The method of any one of clauses 9-14, wherein the first transient property and the second transient property are determined within a predetermined range of measurement dosage.

16. A charged particle beam device configured to charge a substrate, the device comprising:

a charged particle beam source configured to irradiate at least one of a first element, a second element, and a third element that are configured to be arranged symmetrically in the substrate, the first through third elements being electrically conductive;

a detector configured to collect secondary charged particles emitted from the substrate that indicate a capacitance ratio between a first pair of elements and a second pair of elements among the first through third elements; and an electronic control unit configured to determine an overlay measurement based on the capacitance ratio.

17. The device of clause 16, wherein the first element is formed in a first layer and the second and third elements are formed in a second layer.

18. The device of clause 16, wherein the first layer is above the second layer.

19. The device of clause 16, wherein the first layer is below the second layer.

20. The device of clause 17, wherein the first element is formed in a first process step and the second and third elements are formed in a second process step.

21. The device of clause 17, wherein the first element is formed in a first process step, the second element is formed in a second process step, and the third element is formed in a third process step.

22. The device of any one of clauses 16, 20, and 21, wherein the first element, the second element, and the third element are formed in one layer.

23. The device of any one of clauses 16-22, wherein the charged particle beam source is configured to generate a plurality of electron beamlets.

24. The device of any one of clauses 16-23, wherein the first through third elements comprise electrical lines that are substantially parallel to one another.

25. A non-transitory computer-readable medium storing a set of instructions that are executable by one or more processors of a charged particle beam apparatus to cause the charged particle beam apparatus to perform a method comprising:

injecting charge into a charge injection element of a substrate;

determining a first capacitance of a first pair of elements and a second capacitance of a second pair of elements of the substrate;

determining a capacitance ratio based on the first capacitance and the second capacitance; and determining an overlay measurement based on the capacitance ratio.

26. The medium of clause 25, wherein injecting the charge into the charge injection element includes irradiating the charge injection element with a charged particle beam.

27. The medium of clause 25 or clause 26, wherein the set of instructions are executable to cause the charged particle beam apparatus to:

determine the first capacitance as a capacitance between the charge injection element and a first measurement element; and determine the second capacitance as a capacitance between the charge injection element and a second measurement element.

28. The medium of clause 27, wherein the set of instructions are executable to cause the charged particle beam apparatus to:

perform voltage contrast imaging to determine a first voltage of the first measurement element and a second voltage of the second measurement element.

29. The medium of any one of clauses 25-28, wherein the set of instructions are executable to cause the charged particle beam apparatus to:

determine a voltage ratio based on the first capacitance and the second capacitance.

30. The medium of any one of clauses 25-29, wherein the set of instructions are executable to cause the charged particle beam apparatus to:

determine a proportionality factor that represents the substrate.

31. The medium of clause 30, wherein the set of instructions are executable to cause the charged particle beam apparatus to:

determine the overlay measurement based on the proportionality factor and based on the first capacitance or the second capacitance.

32. The medium of clause 25, wherein the set of instructions are executable to cause the charged particle beam apparatus to:

determine a difference between a grey level of a first measurement element and a grey level of a second measurement element.

33. A charged particle beam system comprising:

a charged particle beam source configured to project a charged particle beam on a substrate; and a controller having circuitry configured to:

cause the charged particle beam source to inject charge into a charge injection element of the substrate; determine a first capacitance of a first pair of elements and a second capacitance of a second pair of elements of the substrate;

determine a capacitance ratio based on the first capacitance and the second capacitance; and determine an overlay measurement based on the capacitance ratio.

34. The system of clause 33, wherein injecting the charge into the charge injection element includes irradiating the charge injection element with the charged particle beam.

35. The system of clause 33 or clause 34, wherein the controller has circuitry configured to:

determine the first capacitance as a capacitance between the charge injection element and a first measurement element; and determine the second capacitance as a capacitance between the charge injection element and a second measurement element.

36. The system of clause 35, wherein the controller has circuitry configured to:

perform voltage contrast imaging to determine a first voltage of the first measurement element and a second voltage of the second measurement element.

37. The system of any one of clauses 33-35, wherein the controller has circuitry configured to:

determine a voltage ratio based on the first capacitance and the second capacitance.

38. The system of any one of clauses 33-37, wherein the controller has circuitry configured to:

determine a proportionality factor that represents the substrate.

39. The system of clause 38, wherein the controller has circuitry configured to:

determine the overlay measurement based on the proportionality factor and based on the first capacitance or the second capacitance.

40. The system of clause 33, wherein the controller has circuitry configured to:

determine a difference between a grey level of a first measurement element and a grey level of a second measurement element.

41. A non-transitory computer-readable medium storing a set of instructions that are executable by one or more processors of a charged particle beam apparatus to cause the charged particle beam apparatus to perform a method comprising:

determining a first transient property based on a first capacitance of a first pair of elements of a substrate;

determining a second transient property based on a second capacitance of a second pair of elements of the substrate;

determining a capacitance ratio based on the first transient property and the second transient property; and determining an overlay measurement based on the capacitance ratio.

42. The medium of clause 41, wherein the set of instructions are executable to cause the charged particle beam apparatus to:

determine a difference between a surface potential of the first measurement element and the surface potential of a second measurement element.

43. The medium of clause 41, wherein the set of instructions are executable to cause the charged particle beam apparatus to:

determine a difference between a grey level of a first measurement element and a grey level of a second measurement element.

44. The medium of any one of clauses 41-43, wherein the first pair of elements includes a central element and the first measurement element and the second pair of elements includes the central element and the second measurement element.

45. The medium of any one of clauses 41-44, wherein the set of instructions are executable to cause the charged particle beam apparatus to:

perform voltage contrast imaging.

46. The medium of any one of clauses 41-45, wherein the set of instructions are executable to cause the charged particle beam apparatus to:

determine the first capacitance or the second capacitance.

47. The medium of any one of clauses 41-46, wherein the first transient property and the second transient property are determined within a predetermined range of measurement dosage.

48. A charged particle beam system comprising:

a charged particle beam source configured to project a charged particle beam on a substrate; and a controller having circuitry configured to:

cause the charged particle beam source to project the charged particle beam on a first measurement element and a second measurement element of the substrate;

determine a first transient property based on a first capacitance of a first pair of elements of the substrate; determine a second transient property based on a second capacitance of a second pair of elements of the substrate;

determine a capacitance ratio based on the first transient property and the second transient property; and determine an overlay measurement based on the capacitance ratio.

49. The system of clause 48, wherein the controller has circuitry configured to:

determine a difference between a surface potential of the first measurement element and a surface potential of the second measurement element.

50. The system of clause 48, wherein the controller has circuitry configured to:

determine a difference between a grey level of the first measurement element and a grey level of the second measurement element.

51. The system of any one of clauses 48-50, wherein the first pair of elements includes a central element and the first measurement element and the second pair of elements includes the central element and the second measurement element.

52. The system of any one of clauses 48-51, wherein the controller has circuitry configured to: perform voltage contrast imaging.

53. The system of any one of clauses 48-52, wherein the controller has circuitry configured to: determine the first capacitance or the second capacitance.

54. The system of any one of clauses 48-53, wherein the first transient property and the second transient property are determined within a predetermined range of measurement dosage.

It will be appreciated that the embodiments of the present disclosure are not limited to the exact construction that has been described above and illustrated in the accompanying drawings, and that various modifications and changes can be made without departing from the scope thereof.

The invention claimed is:

1. A charged particle beam system comprising:

a charged particle beam source configured to project a charged particle beam on a substrate; and a controller having circuitry configured to:

cause the charged particle beam source to inject charge into a charge injection element of the substrate;

determine a first capacitance of a first pair of elements and a second capacitance of a second pair of elements of the substrate;

determine a capacitance ratio based on the first capacitance and the second capacitance; and determine an overlay measurement based on the capacitance ratio.

2. The system of claim 1, wherein injecting the charge into the charge injection element includes irradiating the charge injection element with the charged particle beam.

3. The system of claim 1, wherein the controller has circuitry configured to:

determine the first capacitance as a capacitance between the charge injection element and a first measurement element; and determine the second capacitance as a capacitance between the charge injection element and a second measurement element.

4. The system of claim 3, wherein the controller has circuitry configured to:

perform voltage contrast imaging to determine a first voltage of the first measurement element and a second voltage of the second measurement element.

5. The system of claim 1, wherein the controller has circuitry configured to:

determine a voltage ratio based on the first capacitance and the second capacitance.

6. The system of claim 1, wherein the controller has circuitry configured to:

determine a proportionality factor that represents the substrate.

7. The system of claim 6, wherein the controller has circuitry configured to:

determine the overlay measurement based on the proportionality factor and based on the first capacitance or the second capacitance.

8. The system of claim 1, wherein the controller has circuitry configured to:

determine a difference between a grey level of a first measurement element and a grey level of a second measurement element.

9. A non-transitory computer-readable medium storing a set of instructions that are executable by one or more processors of a charged particle beam apparatus to cause the charged particle beam apparatus to perform a method comprising:

injecting charge into a charge injection element of a substrate;

determining a first capacitance of a first pair of elements and a second capacitance of a second pair of elements of the substrate;

determining a capacitance ratio based on the first capacitance and the second capacitance; and determining an overlay measurement based on the capacitance ratio.

10. A method of determining an overlay measurement of a substrate, the method comprising:

injecting charge into a charge injection element of the substrate;

determining a first capacitance of a first pair of elements and a second capacitance of a second pair of elements;

determining a capacitance ratio based on the first capacitance and the second capacitance; and determining the overlay measurement based on the capacitance ratio.

11. The method of claim 10, wherein injecting the charge into the charge injection element includes irradiating the charge injection element with a charged particle beam.

12. The method of claim 10, further comprising:

determining the first capacitance as a capacitance between the charge injection element and a first measurement element; and determining the second capacitance as a capacitance between the charge injection element and a second measurement element.

13. The method of claim 12, further comprising:

performing voltage contrast imaging to determine a first voltage of the first measurement element and a second voltage of the second measurement element.

14. The method of claim 10, further comprising:

determining a voltage ratio based on the first capacitance and the second capacitance.

15. The method of claim 10, further comprising:

determining a proportionality factor that represents the substrate.

16. The medium of claim 9, wherein injecting the charge into the charge injection element includes irradiating the charge injection element with a charged particle beam.

17. The medium of claim 9, wherein the set of instructions are executable to cause the charged particle beam apparatus to:

determine the first capacitance as a capacitance between the charge injection element and a first measurement element; and determine the second capacitance as a capacitance between the charge injection element and a second measurement element.

18. The medium of claim 17, wherein the set of instructions are executable to cause the charged particle beam apparatus to:

perform voltage contrast imaging to determine a first voltage of the first measurement element and a second voltage of the second measurement element.

19. The medium of claim 9, wherein the set of instructions are executable to cause the charged particle beam apparatus to:

determine a voltage ratio based on the first capacitance and the second capacitance.

20. The medium of claim 9, wherein the set of instructions are executable to cause the charged particle beam apparatus to:

determine a proportionality factor that represents the substrate.

* * * * *